United States Patent

Vimpari et al.

[11] Patent Number: 5,404,585
[45] Date of Patent: Apr. 4, 1995

[54] POWER DETECTOR THAT EMPLOYS A FEEDBACK CIRCUIT TO ENABLE CLASS B OPERATION OF A DETECTOR TRANSISTOR

[75] Inventors: Markku Vimpari, Oulu; Arto Seppanen, Oulunsalo, both of Finland

[73] Assignee: Nokia Mobile Phones Ltd., Salo, Finland

[21] Appl. No.: 945,682

[22] Filed: Sep. 16, 1992

[30] Foreign Application Priority Data

Sep. 19, 1991 [FI] Finland .................... 914417

[51] Int. Cl.⁶ .................................... H04B 17/00
[52] U.S. Cl. ............................. 455/115; 455/126; 455/127; 330/296
[58] Field of Search ............. 455/126, 127, 115, 226.2; 330/265, 266, 267, 270, 273, 296

[56] References Cited

U.S. PATENT DOCUMENTS

| | | | |
|---|---|---|---|
| 3,708,756 | 1/1973 | Fajen | 330/296 |
| 4,041,407 | 8/1977 | Main | 330/266 X |
| 4,319,195 | 3/1982 | Matsumura | 329/101 |
| 4,757,271 | 7/1988 | Beale | 330/266 X |
| 4,833,423 | 5/1989 | Molley | 330/270 X |
| 4,881,046 | 11/1989 | Tung | 330/296 |
| 5,280,633 | 1/1994 | Camiade et al. | 455/79 |

FOREIGN PATENT DOCUMENTS

| | | | |
|---|---|---|---|
| 914417 | 4/1992 | Finland . | |
| 2142209 | 5/1990 | Japan . | |
| 812588 | 4/1959 | United Kingdom . | |
| 1458933 | 12/1976 | United Kingdom | H03D 1/10 |
| 2045951A | 11/1980 | United Kingdom | G01R 15/10 |
| 2050631 | 1/1981 | United Kingdom . | |
| 2242984 | 10/1991 | United Kingdom | G01R 21/41 |

*Primary Examiner*—Edward F. Urban
*Attorney, Agent, or Firm*—Perman & Green

[57] ABSTRACT

A power detector for detecting the magnitude of a radio frequency (RF) signal comprises a detector transistor (V1) which provides an output signal (DC-OUT) in dependence upon the input RF signal. The detector transistor is biased with a biasing circuit which comprises two transistors (V2,V3) in a feedback loop coupled to the base of the detector transistor (V1). The detector can be used as both current and voltage amplifier. One of the transistors (V3) in the feedback loop provides temperature compensation.

4 Claims, 1 Drawing Sheet

POWER DETECTOR THAT EMPLOYS A FEEDBACK CIRCUIT TO ENABLE CLASS B OPERATION OF A DETECTOR TRANSISTOR

BACKGROUND OF THE INVENTION

The present invention relates to a power detector for detecting the magnitude of a radio frequency (RF) signal.

Power detectors are used, for example, in control circuits at the output of RF signal power amplifiers. Early power amplifiers had only one output power level, that was tuned to the desired level during the production. However, it is now common to reuse radio channels in some RF communications systems, for example, in cellular radio telephone systems. To avoid interference between the two RF signal power amplifiers using the same channel, the two operate at different power levels, and, therefore it is desirable to be able to select different power levels from a number of available power levels. Power detectors are provided in the control circuitry for the RF signal power amplifiers used in such systems. One such detector comprises a rectifier diode the voltage from the RF signal power amplifier being coupled to the anode at the diode, and the cathode providing a rectified voltage proportional to the coupled voltage. The voltage from the detector is coupled to an amplifier and a comparator controlling a current amplifier, from where the current is supplied to the end stage amplifiers. Thus amplifiers and a circuit generating and regulating the current are needed in addition to the power detector.

In order for the power detector to operate at low power levels the rectifier diode must be biased in some way, because the diode has a certain threshold voltage. This threshold voltage is also temperature dependant, so that the biasing must also take into account changes in the threshold voltage caused by temperature.

In order to compensate for changes in the threshold voltage caused by temperature variations it is known to use a second diode, which is forward biased and from which a biasing voltage is coupled through a resistor to the rectifier diode. Variations of the rectifier diode threshold voltage due to temperature changes is compensated for because the voltage over the second diode changes in the same manner, if the diodes are at the same temperature and if they have equal temperature coefficients.

SUMMARY OF THE INVENTION

According to the present invention, there is provided a power detector for detecting the magnitude of a radio frequency signal, the detector comprising a detector transistor biased by a biasing circuit to operate as a class B amplifier and arranged to generate an output signal having a magnitude proportional to the magnitude of the RF signal coupled to the base of the transistor.

This has the advantage that the power detector is buffered and will carry loads better than a known passive power detector. This leads to a simpler circuit around the detector, and so costs and space are saved when manufacturing the power regulating circuit.

Furthermore because the power detector in accordance with the application is operable to amplify either voltage or current, the fields of application of the detector are broader than for a known passive detector.

BRIEF DESCRIPTION OF THE DRAWINGS

An embodiment of the invention will now be described, by way of example only, with reference to the accompanying drawings, of which.

DETAILED DESCRIPTION OF THE INVENTION

Figure 1:
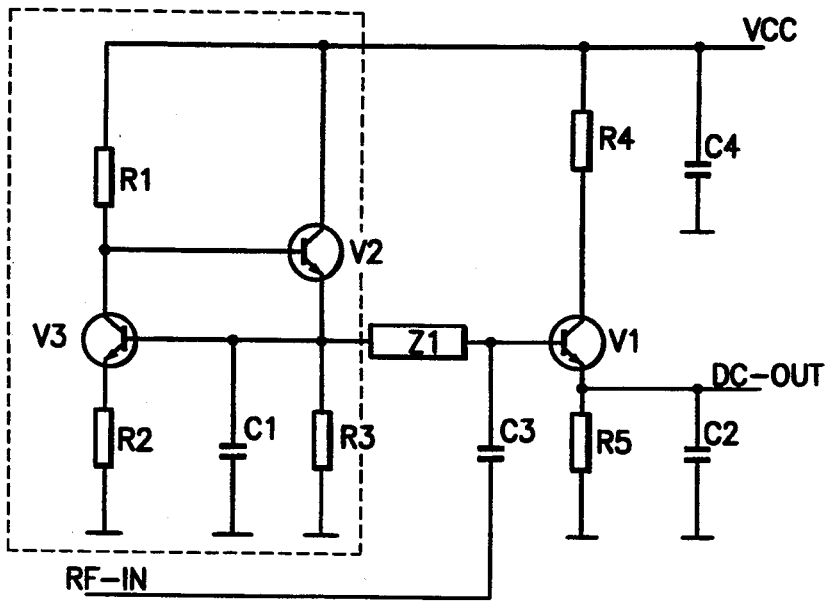
FIG. 1 illustrates the circuit diagram of an active power detector in accordance with the invention.

As shown in FIG. 1 an RF signal to be measured is coupled to the base of a detector transistor V1 through a capacitor C3, and a DC output voltage is obtained at the emitter of the detector transistor V1. The DC output voltages vary with the value of the applied RF signal i.e. the detector transistor V1 acts to "detect" the power level of the RF signal. When a sine-wave signal is coupled to the base of the detecter transistor V1, the transistor V1 will operate as a half-wave rectifier, i.e. it will conduct on positive half-waves and produce zero output current on negative half-waves. Because the transistor V1 is conducting on positive half-waves of the RF signal it will charge the capacitor C2, producing a dc-voltage output DC-OUT proportional to the RF signal.

In order for the detector to operate at low power levels, the transistor V1 is biased using a biasing circuit, indicated by the dotted line in FIG. 1.

The biasing circuit comprises two transistors V2, V3, configured in a feedback loop. The collector of transistor V3 is coupled to the base of transistor V2 and the emitter of transistor V2 to the base of transistor V3. The common junction of the base of transistor V3 and the emitter of V2 is coupled through a resistor R1 to the collector of transistor V2. A resistor R2 is coupled to the emitter of transistor V3. A resistor R3 is coupled to the common junction of the feedback loop transistors V2,V3 and the impedance Z1. This is all shown clearly in FIG. 1. The voltage over resistor R3 is maintained such that the transistor V3 and then also the detector transistor V1 stays at or slightly above the border of its active region i.e. it remains "active" ie. acting as an amplifier, rather than in its "inactive" state where it is open. The quiescent current is thus almost zero, and the detector transistor V1 is biased to operate as a class B amplifier, and, therefore, at low RF power. In order to achieve an optimal balance, the transistors V1 and V3 must be of the same type.

When the transistors V1 and V3 are of the same type, and located at the same temperature, the threshold voltage of transistor V3 changes in the same proportion as the threshold voltage of transistor V1 with temperature. Then also the current supplied to the base of the detector transistor V1 will change when the temperature changes, maintaining the detector transistor V1 at the same operating point or at the border to the active region at different temperatures. With the aid of the resistor R1 it is possible to control the value of the current coupled to the detector transistor base. If the resistances R2 and R5 are selected to be equal, then it is possible with the resistor R1 to control the value of the transistor base current. If the resistance R1 is selected to be substantially larger than the resistances R2 and R5, then the DC-output signal DC-OUT is almost zero when the RF signal is zero, i.e. the state of the detector transistor V1 stays at or slightly above the border of its active region until an RF signal is supplied to the base of the detector transistor V1.

The function of the capacitor C4 is to filter out interferences from the supply voltage.

An impedance Z1 and a capacitor C1 prevent the RF signal from entering the biasing circuit. The impedance Z1 can be formed by a strip or by a resistor.

Figure 2:
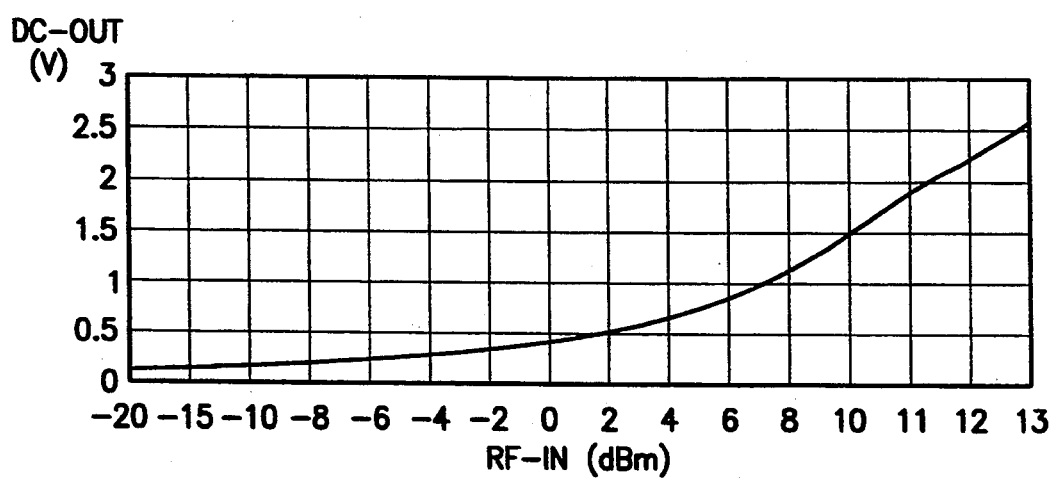
FIG. 2 is an input/output voltage diagram of the power detector of FIG. 1.

FIG. 2 shows the relation between the input voltage RF-IN and the output voltage DC-OUT of the active power detector according to the invention. The state of the detector transistor V1 can be seen clearly in the figure. When the input signal RF-IN supplied to the base of transistor V1 is −20 dBm or 0,1 mV, the output voltage DC-OUT provided by the transistor is almost zero, and it rises as the input voltage RF-IN rises. Thus the transistor V1 begins to conduct only when a signal is connected to the base, because the transistor is biased to operate as a class B amplifier.

The active power detector in accordance with the invention may also be used as a voltage amplifier as well as a current. This is possible by taking the output signal DC-OUT from the collector of transistor V1, rather than at the emitter. Then the voltage gain is proportional to the ratio of resistors R4/R5. In principle the resistor R4 is not needed when the detector is operated as a current amplifier, because then the resistor's only function is to limit the collector current of the transistor V1. The resistor R4 is included in the circuit so that it will be possible to use the circuit as a voltage amplifier by changing the place of the output node to the collector of transistor V1.

It will be clear from the foregoing description that various modifications are possible to a person skilled in the art, within the scope of the present invention.

We claim:

1. A power detector for detecting the magnitude of a radio frequency (RF) signal and for generating an output signal having a magnitude that is proportional to said magnitude of said RF signal, the power detector comprising:
   a detector transistor;
   an RF signal input coupled to a base electrode of said detector transistor; and
   a bias circuit connected to said base electrode for applying a bias potential to said detector transistor to enable class B operation thereof, said bias circuit including a first transistor having a base electrode coupled to said base electrode of said detector transistor and feedback means responsive to a change in conduction through said first transistor for adjusting said bias potential to maintain said class B operation of said detector transistor, said feedback means including a first resistor connected between a bias supply and a collector of said first transistor, a resistor connecting said base electrode of said first transistor to a reference potential and a second transistor connected between said bias supply and said base electrode of said first transistor, conduction variations of said second transistor providing said adjusting of said bias potential to said detector transistor.

2. A power detector according to claim 1, wherein an output signal is obtained at an emitter of the detector transistor.

3. A power detector according to claim 1, wherein an output signal is obtained at a collector of the detector transistor.

4. The power detector as recited in claim 1, wherein a base electrode of said second transistor is connected to said collector of said first transistor to enable conduction changes in said first transistor to be sensed at said base electrode of said second transistor so that conduction changes in said first transistor are enabled to control conduction through said second transistor.

* * * * *